(12) United States Patent
Hatori

(10) Patent No.: US 10,958,036 B2
(45) Date of Patent: Mar. 23, 2021

(54) SEMICONDUCTOR LIGHT-EMITTING DEVICE AND OPTICAL DEVICE

(71) Applicants: FUJITSU LIMITED, Kawasaki (JP); Photonics Electronics Technology Research Association, Tokyo (JP)

(72) Inventor: Nobuaki Hatori, Tsukuba (JP)

(73) Assignees: FUJITSU LIMITED, Kawasaki (JP); PHOTONICS ELECTRONICS TECHNOLOGY RESEARCH ASSOCIATION, Tokyo (JP)

(*) Notice: Subject to any disclaimer, the term of this patent is extended or adjusted under 35 U.S.C. 154(b) by 95 days.

(21) Appl. No.: 16/174,523

(22) Filed: Oct. 30, 2018

(65) Prior Publication Data

US 2019/0131761 A1 May 2, 2019

(30) Foreign Application Priority Data

Nov. 2, 2017 (JP) ................................ 2017-213189

(51) Int. Cl.
| | |
|---|---|
| *H01S 5/12* | (2021.01) |
| *G02B 6/42* | (2006.01) |
| *H01S 5/028* | (2006.01) |
| *H01S 5/34* | (2006.01) |
| *H01S 5/22* | (2006.01) |
| *H01S 5/343* | (2006.01) |
| *H01S 5/026* | (2006.01) |
| *G02B 6/12* | (2006.01) |

(52) U.S. Cl.
CPC ............ *H01S 5/028* (2013.01); *H01S 5/0287* (2013.01); *H01S 5/0288* (2013.01); *H01S 5/12* (2013.01); *H01S 5/1221* (2013.01); *H01S 5/341* (2013.01); *G02B 6/4206* (2013.01); *G02B 6/4212* (2013.01); *G02B 2006/12195* (2013.01); *H01S 5/026* (2013.01); *H01S 5/22* (2013.01); *H01S 5/34313* (2013.01); *H01S 2301/02* (2013.01); *H01S 2301/163* (2013.01)

(58) Field of Classification Search
None
See application file for complete search history.

(56) References Cited

U.S. PATENT DOCUMENTS

| | | | | |
|---|---|---|---|---|
| 5,870,417 A * | 2/1999 | Verdiell | ............. | G02B 6/12007 372/102 |
| 6,327,064 B1 * | 12/2001 | Zhu | ...................... | H04B 10/506 372/32 |
| 2003/0063647 A1 * | 4/2003 | Yoshida | .............. | H01S 5/06256 372/50.1 |
| 2003/0064537 A1 * | 4/2003 | Yoshida | .................. | H01S 5/162 438/32 |
| 2004/0071181 A1 * | 4/2004 | Huang | ................ | H01S 5/06256 372/106 |
| 2010/0006784 A1 | 1/2010 | Mack et al. | | |

\* cited by examiner

*Primary Examiner* — Sung H Pak
*Assistant Examiner* — Hoang Q Tran
(74) *Attorney, Agent, or Firm* — Westerman, Hattori, Daniels & Adrian, LLP

(57) ABSTRACT

A semiconductor light-emitting device includes an active layer including quantum dots, a diffraction grating, a low-reflectance film disposed at a light-emitting end of the active layer, and a high-reflectance film disposed at another end of the active layer and having an optical reflectance higher than an optical reflectance of the low-reflectance film.

8 Claims, 9 Drawing Sheets

SEMICONDUCTOR LIGHT-EMITTING DEVICE AND OPTICAL DEVICE

CROSS-REFERENCE TO RELATED APPLICATIONS

This application is based upon and claims the benefit of priority of Japanese Patent Application No. 2017-213189 filed on Nov. 2, 2017, the entire contents of which are incorporated herein by reference.

FIELD

An aspect of this disclosure relates to a semiconductor light-emitting device and an optical device.

BACKGROUND

In the field of optical devices, development of silicon photonics technology for forming optical functional devices on a silicon substrate is being conducted because of its superiority as processing technology, its industrial spillover effects, and demand for miniaturization; and research is being conducted on an integrated optical device formed by arranging optical components such as an optical modulator and an optical receiver on a silicon substrate. Because silicon itself has no light-emitting mechanism, an external light source is necessary to generate an optical signal. To provide an external light source, a hybrid integration method may be used. In this method, for example, an optical spot-size converter is provided on a silicon optical waveguide, and the silicon optical waveguide is optically coupled to a laser diode (LD) used as an external light source by flip-chip mounting.

SUMMARY

According to an aspect of this disclosure, there is provided a semiconductor light-emitting device that includes an active layer including quantum dots, a diffraction grating, a low-reflectance film disposed at a light-emitting end of the active layer, and a high-reflectance film disposed at another end of the active layer and having an optical reflectance higher than an optical reflectance of the low-reflectance film.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

In an integrated optical device, there are multiple light reflection points such as an incident point of an optical modulator and a grating coupler. When an LD is mounted by hybrid integration, there is concern that feedback light reflected from these reflection points may influence the oscillation of the LD.

Providing an isolator is a well-known technique to reduce the influence of the feedback light on an LD. For example, US Patent Application Publication No. 2010/0006784 discloses an integrated optical device that includes an LD, a ball lens, and an isolator. In this integrated optical device, light output from the LD is concentrated by the ball lens, and feedback light is reduced by the isolator. However, this integrated optical device needs a lens and an isolator in addition to an LD. This in turn complicates the configuration of an optical device and increases material and mounting costs.

An aspect of this disclosure makes it possible to provide a semiconductor light-emitting device and an optical device having a comparatively-simple configuration and high feedback-light resistance.

Embodiments of the present invention are described below with reference to the accompanying drawings.

First Embodiment

Figure 1:
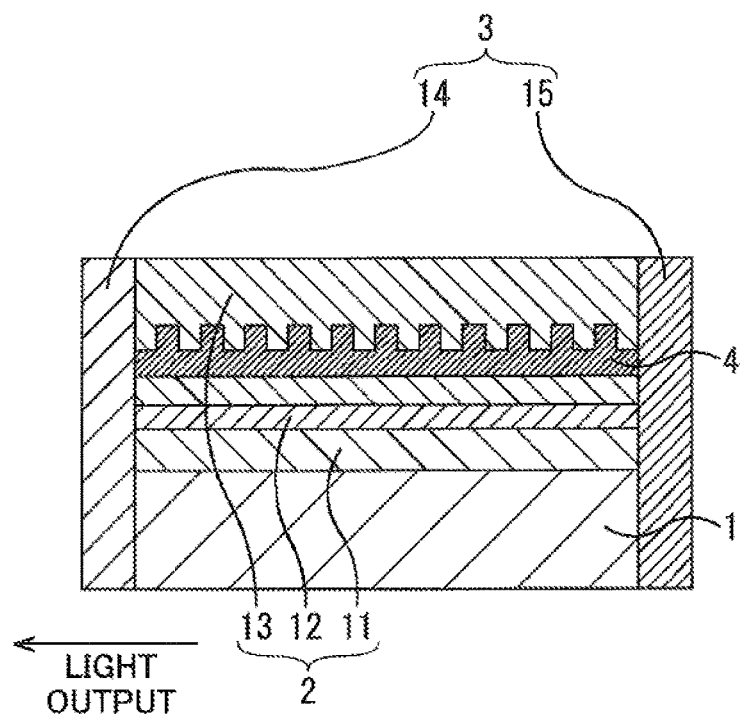
FIG. 1 is a cross-sectional view of a DFB-LD according to a first embodiment.

A first embodiment provides a distributed-feedback (DFB) laser diode (LD) (DFB-LD) that is an example of a semiconductor light-emitting device. FIG. 1 is a cross-sectional view of the DFB-LD according to the first embodiment.

<Configuration of DFB-LD>

The DFB-LD includes a substrate 1 comprised of, for example, GaAs, an optical waveguide 2 disposed on the substrate 1, reflecting mirrors 3 disposed on end faces of the optical waveguide 2, and upper and lower electrodes (not shown).

The optical waveguide 2 is a ridge optical waveguide. The optical waveguide 2 includes a lower cladding layer 11 comprised of, for example, AlGaAs; an upper cladding layer 13 disposed above the lower cladding layer 11 and comprised of, for example, GaInP; and an active layer 12 disposed between the lower cladding layer 11 and the upper cladding layer 13. The active layer 12 includes quantum dots and is comprised of, for example, InGaAs or InAs. A diffraction grating 4 for enabling output of light with a single wavelength is provided in the upper cladding layer 13 above the active layer 12.

The reflecting mirrors 3 include a low-reflectance film 14 disposed at one end (front-end face or light-emitting front-end face), which is a light-emitting end, of the optical waveguide 2 (or the active layer 12); and a high-reflectance film 15 disposed at another end (rear-end face) of the optical waveguide 2 and having an optical reflectance higher than the optical reflectance of the low-reflectance film 14. The low-reflectance film 14 is different from an anti-reflection (AR) film and has an optical reflectance higher than the optical reflectance of an AR film. The optical reflectance of the low-reflectance film 14 is preferably greater than or equal to about 1% and less than or equal to about 10%. The optical reflectance of the high-reflectance film 15 is preferably greater than or equal to about 80%. Also, the optical reflectance of the high-reflectance film 15 is preferably less than or equal to about 50% at a gain peak wavelength of the active layer 12.

The low-reflectance film 14 is formed by stacking multiple types of dielectric films with different optical reflectances. The thicknesses and the number of the dielectric films are adjusted appropriately to achieve a desired optical reflectance. For example, the low-reflectance film 14 is formed by stacking two types of dielectric films such as an $Al_2O_3$ film and a $TiO_2$ film with different optical reflectances while adjusting the thicknesses and the number of the dielectric films to achieve a desired optical reflectance (which is at a predetermined value greater than or equal to about 1% and less than or equal to about 10%).

The high-reflectance film 15 is formed by stacking multiple types of material films with different optical reflectances. The thicknesses and the number of the dielectric films are adjusted appropriately to achieve a desired optical reflectance. For example, the high-reflectance film 15 is formed by stacking an Si film and an $Al_2O_3$ film (a dielectric film) with different optical reflectances while adjusting the thicknesses and the number of the films to achieve a desired optical reflectance (which is at a predetermined value greater than or equal to about 80%, or at a predetermined value less than or equal to about 50% at the gain peak wavelength of the active layer 12).

In a general resonator configuration of a DFB-LD, an AR film is often provided to minimize the optical reflectance. This configuration makes it possible to minimize the phase influence at the light-emitting front-end face. On the other hand, with the configuration where the AR film is provided at the light-emitting end, feedback light directly enters the active layer, and the DFB-LD is greatly influenced by the feedback light, i.e., the feedback-light resistance of the DFB-LD is reduced. In the first embodiment, the feedback-light resistance of the DFB-LD is improved by making the optical reflectance of the low-reflectance film 14 at the light-emitting end greater than the optical reflectance of an AR film and thereby reducing the coupling rate to the active layer 12.

A coupling rate $\kappa$ of feedback light to the DFB-LD is expressed by formula (1) below. In formula (1), $R_2$ indicates an optical reflectance of the light-emitting front-end face, $R_3$ indicates an optical reflectance of an external reflection point reflecting light emitted from the DFB-LD, L indicates the device length of the DFB-LD, $n_{r0}$ is a constant indicating the equivalent refractive index of the DFB-LD, and c is a constant indicating the light velocity. Formula (1) indicates that the coupling rate $\kappa$ can be reduced by increasing the optical reflectance $R_2$. Formula (1) also indicates that the coupling rate $\kappa$ can be reduced by increasing the device length L.

$$\kappa = \frac{c}{2n_{r0}L}(1 - R_2)\sqrt{\frac{R_3}{R_2}} \quad (1)$$

Figure 2:
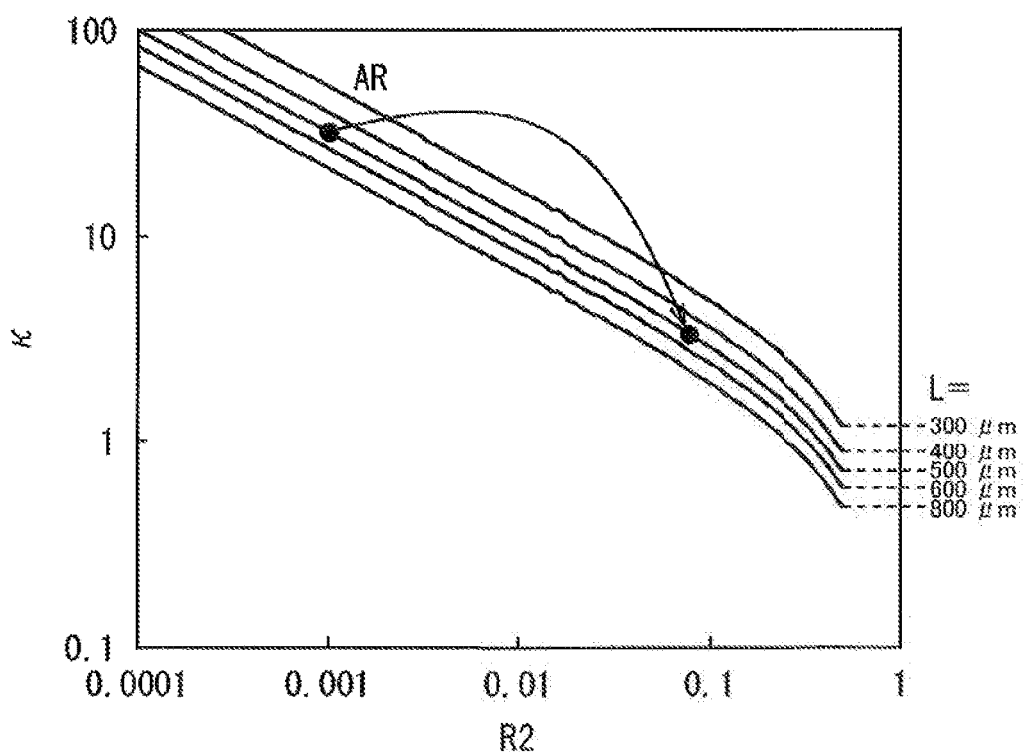
FIG. 2 is a graph indicating relationships between an optical reflectance of a light-emitting front-end face and a coupling rate in the DFB-LD.

FIG. 2 is a graph indicating relationships between the optical reflectance $R_2$ of the light-emitting front-end face and the coupling rate $\kappa$ in the DFB-LD. FIG. 2 illustrates the relationships calculated by varying the device length L from about 300 nm to about 800 nm.

Compared with a case where an AR film is provided on the light-emitting front-end face, when the optical reflectance $R_2$ is increased to, for example, about 7%, the coupling rate $\kappa$ is reduced to about one tenth. When the optical reflectance $R_2$ is less than 1%, it is difficult to sufficiently reduce the coupling rate $\kappa$. When the optical reflectance $R_2$ exceeds 10%, the DFB-LD tends to oscillate in the Fabry-Perot (FP) mode at the gain peak wavelength of the active layer 12 including quantum dots, and the single-mode operation of the DFB-LD may be hindered. In the first embodiment, the optical reflectance $R_2$ of the low-reflectance film 14 is set at a value that is greater than or equal to 1% and less than or equal to 10%. This configuration makes it possible to sufficiently improve the feedback-light resistance of the DFB-LD while ensuring the single-mode operation of the DFB-LD.

On the other hand, the optical reflectance of the rear-end face located opposite the light-emitting end of the DFB-LD needs to be set at a sufficiently-high value to achieve high output. In the first embodiment, the optical reflectance of the high-reflectance film 15 is preferably greater than or equal to 80%.

As described above, to ensure the single-mode operation of the DFB-LD, the optical reflectance $R_2$ and the device length L should not be set at excessively-high values. For this reason, it is desirable to configure the reflecting mirror such that the optical reflectance decreases near the gain peak wavelength of the active layer 12 at which the DFB-LD tends to oscillate in the FP mode and such that the optical reflectance is maintained at the DFB wavelength. Specifically, in the first embodiment, the optical reflectance of the high-reflectance film 15 on the rear-end face is less than or equal to 50% at the gain peak wavelength of the active layer 12. This configuration makes it possible to suppress the FP-mode oscillation of the DFB-LD and to improve the feedback-light resistance of the DFB-LD.

Figure 3:
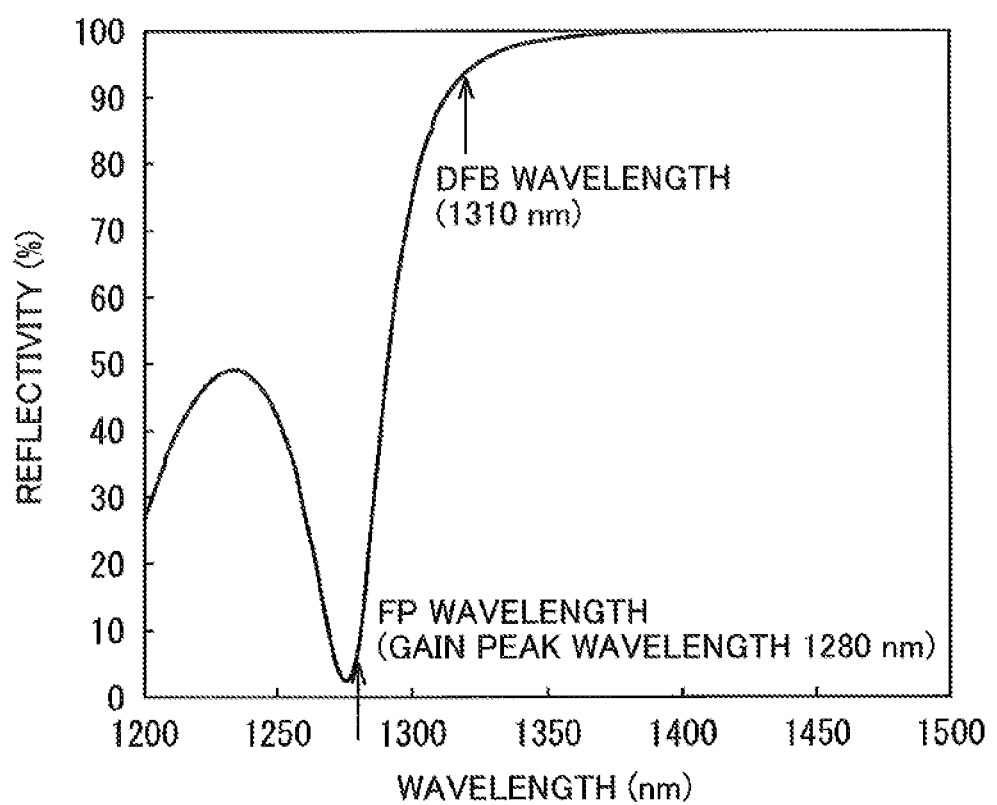
FIG. 3 is a graph indicating a relationship between an oscillation wavelength and an optical reflectance in the DFB-LD.

FIG. 3 is a graph indicating a relationship between an oscillation wavelength and an optical reflectance (reflectivity) in the DFB-LD. As indicated by FIG. 3, the FP-mode oscillation can be sufficiently suppressed by using, for the rear-end face, a high-reflectance film that has, for example, an optical reflectance less than or equal to 10% at a gain peak wavelength of about 1280 nm and has, for example, an optical reflectance of about 90% at a DFB wavelength of about 1310 nm.

Figure 4:
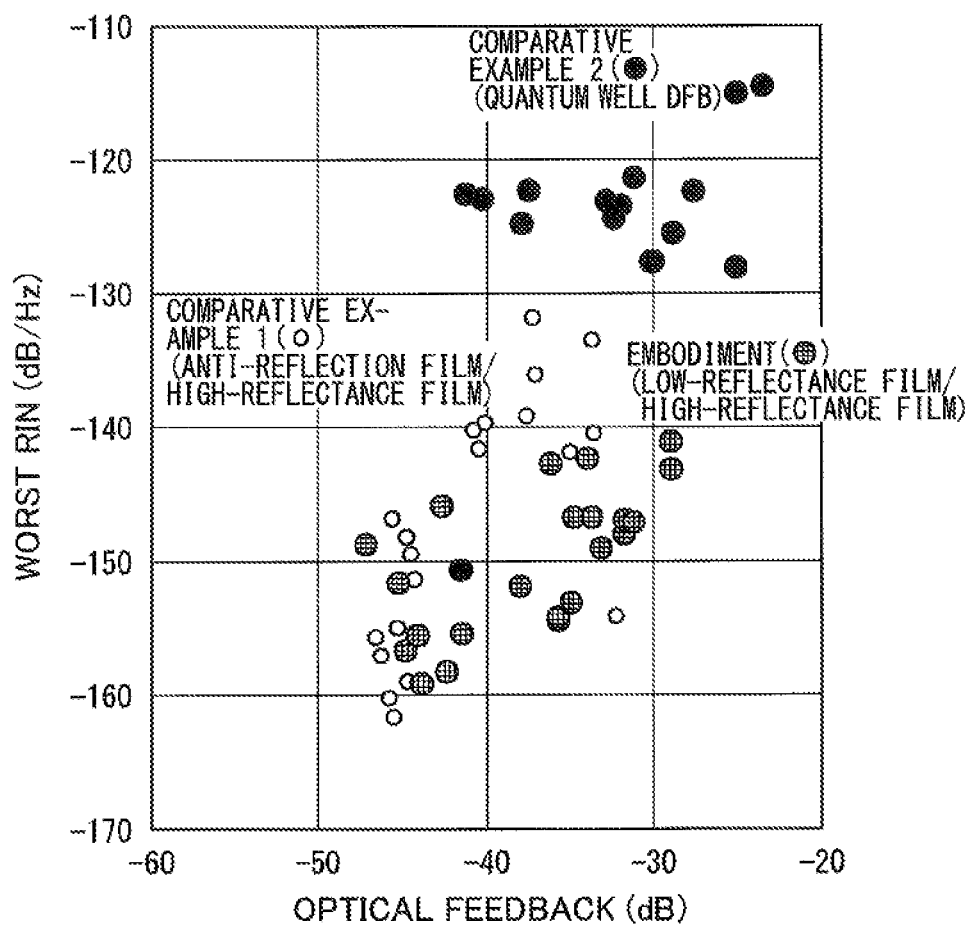
FIG. 4 is a graph indicating relative intensity noise in the DFB-LD of the first embodiment and DFB-LDs of comparative examples.

FIG. 4 is a graph indicating relative intensity noise in the DFB-LD of the first embodiment and DFB-LDs of comparative examples. The DFB-LD of the first embodiment includes the active layer 12 including quantum dots and the low-reflectance film 14 having an optical reflectance greater than or equal to about 1% and less than or equal to about 10%. In FIG. 4, it is assumed that the low-reflectance film 14 has an optical reflectance of about 7.5%. In FIG. 4, the horizontal axis indicates optical feedback (dB) and the vertical axis indicates relative intensity noise (RIN) (dB/Hz). A DFB-LD used in a comparative example 1 has a configuration obtained by replacing the low-reflectance film 14 on the light-emitting front-end face in the configuration of FIG. 1 with an AR film. A DFB-LD used in a comparative example 2 has a configuration obtained by replacing the active layer 12 including quantum dots in the configuration of FIG. 1 with an active layer having a quantum well.

As indicated by FIG. 4, the relative intensity noise relative to the optical feedback in the comparative example 1 is poor as compared to the relative intensity noise in the first embodiment. Also, the relative intensity noise relative to the optical feedback in the comparative example 2 is worse than that in the comparative example 1. Thus, the DFB-LD of the first embodiment has feedback-light resistance that is higher than the feedback-light resistance of the DFB-LDs of the comparative examples 1 and 2.

<Method of Manufacturing DFB-LD>

A method of manufacturing the DFB-LD according to the first embodiment is described below. FIGS. 5A through 6C are drawings illustrating a method of manufacturing the DFB-LD according to the first embodiment.

Figure 5A:
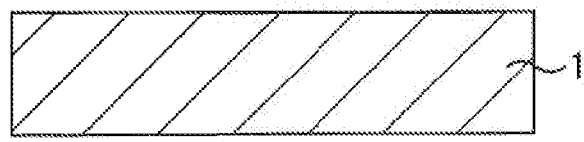
FIGS. 5A through 5D are drawings illustrating a method of manufacturing a DFB-LD according to the first embodiment.

First, as illustrated by FIG. 5A, the substrate 1 comprised of, for example, GaAs is prepared.

Figure 5B:

Next, as illustrated by FIG. 5B, the lower cladding layer 11 is formed on the substrate 1.

For example, the lower cladding layer 11 may be formed by growing AlGaAs on the substrate 1 by molecular beam epitaxy (MBE). Instead of MBE, metal organic vapor phase epitaxy (MOVPE) may be used to form the lower cladding layer 11 on the substrate 1.

Figure 5C:
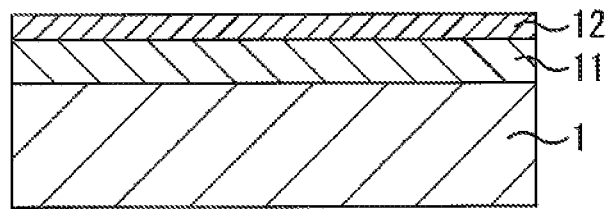

Next, as illustrated by FIG. 5C, the active layer 12 including quantum dots is formed.

For example, using MBE, quantum dots comprised of InGaAs and arranged on the lower cladding layer 11 are formed, and multiple (e.g., eight) layers comprised of GaAs are formed to cover the quantum dots. Instead of InGaAs, InAs may also be used as a material of the quantum dots. Through the above process, the active layer 12 is formed on the lower cladding layer 11. The active layer 12 may be doped with a p-type impurity to improve light output characteristics at a high temperature.

Figure 5D:
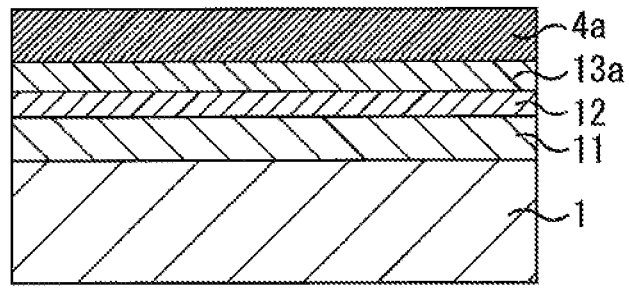

Next, as illustrated by FIG. 5D, GaInP layers 13a and 4a are formed.

For example, GaInP is grown on the active layer 12 by MBE to form the GaInP layers 13a and 4a.

Figure 6A:
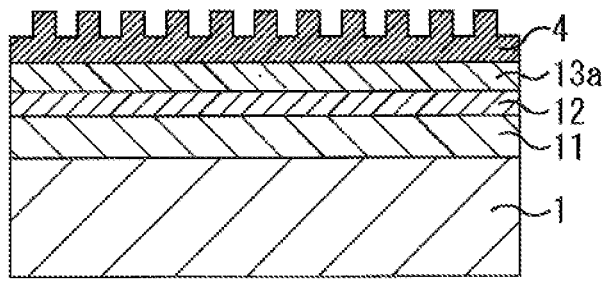
FIGS. 6A through 6C are drawings illustrating a method of manufacturing a DFB-LD according to the first embodiment.

Next, as illustrated by FIG. 6A, the diffraction grating 4 is formed.

For example, the GaInP layer 4a is processed by lithography and etching to form the diffraction grating 4 on the GaInP layer 13a.

Figure 6B:
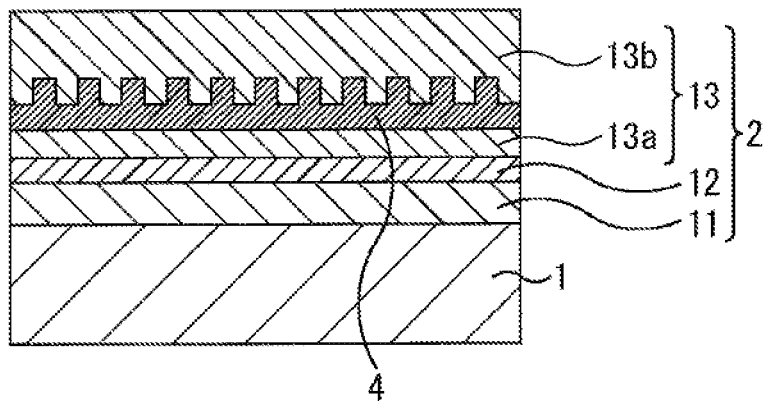

Next, as illustrated by FIG. 6B, a GaInP layer 13b is formed.

For example, GaInP is grown by MBE to fill and cover the diffraction grating 4 and thereby form the GaInP layer 13b on the diffraction grating 4. The GaInP layers 13a and 13b constitute the upper cladding layer 13.

Figure 6C:
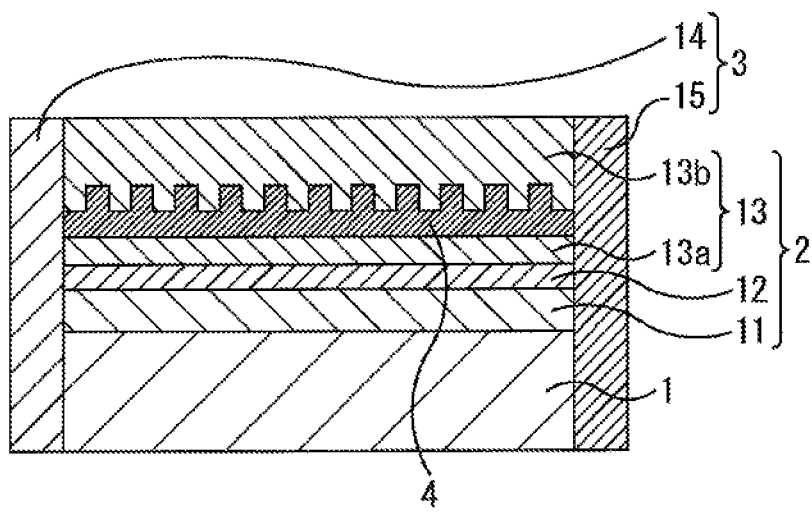

Next, as illustrated by FIG. 6C, the reflecting mirrors 3 are formed. For example, the upper cladding layer 13 is processed by lithography and etching into a ridge shape. As a result, the ridge optical waveguide 2 including the lower cladding layer 11, the active layer 12, and the processed upper cladding layer 13 is formed.

Next, a pair of electrodes are formed above and below the optical waveguide 2.

Next, the low-reflectance film 14 is formed at one end (front-end face), which is a light-emitting end, of the optical waveguide 2; and the high-reflectance film 15, which has an optical reflectance higher than the optical reflectance of the low-reflectance film 14, is formed at another end (rear-end face) of the optical waveguide 2. For example, the low-reflectance film 14 is formed by stacking $Al_2O_3$ and $TiO_2$ layers using sputtering or vapor deposition while adjusting the thicknesses and the number of layers to achieve a desired optical reflectance that is greater than or equal to about 1% and less than or equal to about 10%.

The low-reflectance film 14 with an optical reflectance of about 1% can be formed by stacking one set of an $Al_2O_3$ layer with a thickness of about 120 nm and a $TiO_2$ layer with a thickness of about 110 nm. Also, the low-reflectance film 14 with an optical reflectance of about 10% can be formed by stacking two sets of an $Al_2O_3$ layer with a thickness of about 225 nm and a $TiO_2$ layer with a thickness of about 245 nm.

For example, the high-reflectance film 15 is formed by stacking Si and $Al_2O_3$ layers using sputtering or vapor deposition while adjusting the thicknesses and the number of layers so that the high-reflectance film 15 has an optical reflectance greater than or equal to about 80% and has an optical reflectance less than or equal to about 50% at the gain peak wavelength of the active layer 12. The high-reflectance film 15 having an optical reflectance of about 80% and having an optical reflectance of about 50% at the gain peak wavelength can be formed by stacking four sets of an Si layer with a thickness of about 111 nm and an $Al_2O_3$ layer with a thickness of about 256 nm.

Through the above process, the reflecting mirrors 3 including the low-reflectance film 14 and the high-reflectance film 15 are formed.

The DFB-LD of the first embodiment is manufactured as described above.

As described above, the first embodiment makes it possible to provide a DFB-LD that has a comparatively simple configuration but yet can operate in a single mode and has high feedback-light resistance.

EXAMPLES

Examples of DFB-LDs according to the first embodiment are described below.

Example 1

In Example 1, the low-reflectance film 14 on the front-end face has an optical reflectance of about 7.5%, and the high-reflectance film 15 on the rear-end face has an optical reflectance of about 95%. The low-reflectance film 14 is formed by stacking two sets of an $Al_2O_3$ layer with a thickness of about 220 nm and a $TiO_2$ layer with a thickness of about 250 nm to adjust the optical reflectance to about 7.5%.

The high-reflectance film 15 is formed by stacking two sets of an Si layer with a thickness of about 86 nm and an $Al_2O_3$ layer with a thickness of about 225 nm to adjust the optical reflectance to about 95%.

In Example 1, a photoluminescence (PL) wavelength of the active layer 12 including quantum dots at the ambient temperature is about 1280 nm. The active layer 12 is doped with a p-type impurity to improve light output characteristics at a high temperature. The coupling coefficient of the diffraction grating 4 is set at about 30 $cm^{-1}$. The DFB wavelength is set at about 1310 nm that is 30 nm longer than the gain peak wavelength. The device length is about 500 μm.

In Example 1, the high-reflectance film 15 on the rear-end face is configured to have a high optical reflectance of about 95% to suppress light output from the rear-end face and increase light output from the front-end face. On the front-end face, the low-reflectance film 14 with a low optical reflectance of about 7.5% is provided instead of an AR film. With this configuration, compared with a configuration where an AR film is provided on the front-end face, the coupling rate of feedback light to the active layer 12 is reduced to about one tenth and the feedback light resistance is improved.

An oscillation threshold gain $g_{th}$ in the FP mode at the gain peak wavelength of the active layer 12 is obtained by formula (2) below. In formula (2), L indicates a device length, $R_f$ indicates an optical reflectance of the front-end face, and $R_r$ indicates an optical reflectance of the rear-end face.

$$g_{th} = \frac{1}{L} \ln\left(\frac{1}{\sqrt{R_f R_r}}\right) \quad (2)$$

When values in Example 1 are substituted for parameters in formula (2), the oscillation threshold gain $g_{th}$ in the FP mode becomes 27 cm$^{-1}$. With the DFB-LD of Example 1 that includes the active layer 12 including quantum dots and the diffraction grating 4, if the oscillation threshold gain $g_{th}$ were set to less than about 26 cm$^{-1}$, the DFB-LD would oscillate both in the DFB mode and the FP mode at the same time. Therefore, to enable the DFB-LD to operate only in the DFB mode, it is necessary to set the optical reflectances of the end faces and the device length (resonator length) such that the oscillation threshold gain $g_{th}$ in the FP mode becomes greater than or equal to 26 cm$^{-1}$. With the configuration of Example 1, the oscillation threshold gain $g_{th}$ in the FP mode is 27 cm$^{-1}$ that is greater than 26 cm$^{-1}$ and therefore FP-mode oscillation can be suppressed.

Thus, the configuration of Example 1 can improve the feedback-light resistance of a DFB-LD and improve the stability of the single-mode operation.

Example 2

In Example 2, the low-reflectance film 14 on the front-end face has an optical reflectance of about 1%, and the high-reflectance film 15 on the rear-end face has an optical reflectance of about 90%. The high-reflectance film 15 is configured to be wavelength dependent. That is, the high-reflectance film 15 is configured such that the optical reflectance of the high-reflectance film 15 becomes less than or equal to 10%, e.g., about 8.8%, near the gain peak wavelength, e.g., about 1280 nm, of the quantum dots. The low-reflectance film 14 is formed by stacking one set of an Al$_2$O$_3$ layer with a thickness of about 120 nm and a TiO$_2$ layer with a thickness of about 110 nm to adjust the optical reflectance to about 1%. The high-reflectance film 15 is formed by stacking five sets of an Si layer with a thickness of about 109 nm and an Al$_2$O$_3$ layer with a thickness of about 251 nm. With this configuration, in the ambient temperature, the high-reflectance film 15 has an optical reflectance of about 90% (at a DFB wavelength of about 1310 nm) and has an optical reflectance of about 8.8% near the gain peak wavelength (about 1280 nm) of the quantum dots. Other parameters of the DFB-LD of Example 2 are substantially the same as those of the DFB-LD of Example 1.

With the configuration where the optical reflectance of the low-reflectance film 14 on the front-end face is set at 1%, compared with a configuration where an AR film is provided on the front-end face, the coupling rate of feedback light to the active layer 12 is reduced to about 30% and the feedback light resistance is improved.

Figure 7A:
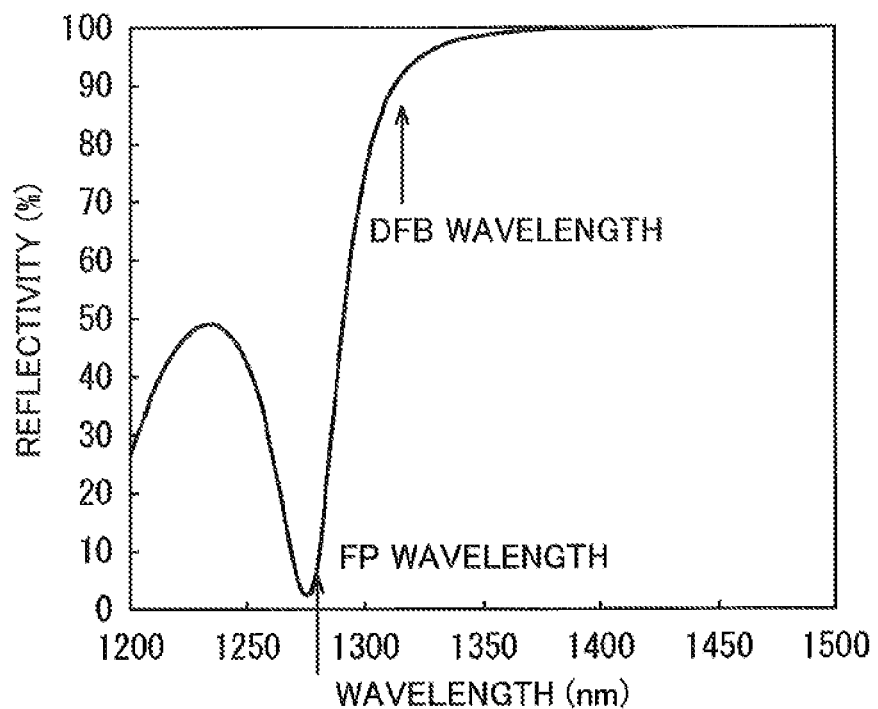
FIGS. 7A and 7B are graphs illustrating characteristics of a DFB-LD according to a second example of the first embodiment.
Figure 7B:
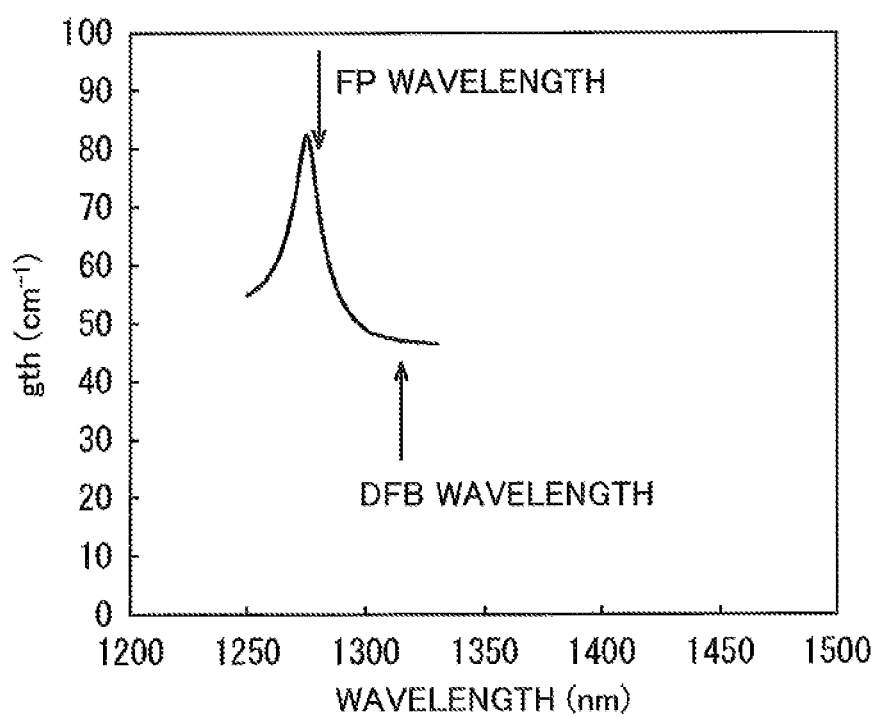

As illustrated in FIG. 7A, the optical reflectance (reflectivity) of the high-reflectance film 15 is about 8.8% at the gain peak wavelength (about 1280 nm) of the active layer 12. Because the optical reflectance of the low-reflectance film 14 at the front-end face is set at 1%, the oscillation threshold gain $g_{th}$ in the FP mode at a gain peak wavelength of about 1280 nm increases to about 73 cm$^{-1}$ as illustrated in FIG. 7B. As a result, the FP-mode oscillation at a gain peak wavelength of about 1280 nm is suppressed.

The FP-mode oscillation more likely occurs when the environmental temperature of the DFB-LD decreases. The quantum-dot gain spectrum has temperature dependence of about 0.5 nm/° C., and the gain peak wavelength becomes about 1267.5 at 0° C. On the other hand, the DFB wavelength has temperature dependence of 0.07 nm/° C. and becomes 1308 nm at 0° C. Because the gain at the DFB wavelength is lower than the quantum-dot gain, the DFB-LD becomes more likely to operate in the FP mode. In Example 2, at a gain peak wavelength of about 1267.5 nm, the optical reflectance of the high-reflectance film 15 on the rear-end face is about 13%, and the oscillation threshold gain is high at about 66 cm$^{-1}$. Accordingly, the FP-mode oscillation is suppressed even at 0° C.

Thus, the configuration of Example 2 can improve the feedback-light resistance of a DFB-LD and improve the stability of the single-mode operation.

Example 3

In Example 3, the low-reflectance film 14 on the front-end face has an optical reflectance of about 10%, and the high-reflectance film 15 on the rear-end face has an optical reflectance of about 90%. With the configuration where the optical reflectance of the low-reflectance film 14 is set at about 10%, compared with a configuration where an AR film is provided on the front-end face, the coupling rate of feedback light to the active layer 12 is reduced to about 10% and the feedback light resistance is improved. The high-reflectance film 15 is configured to be wavelength dependent. That is, the high-reflectance film 15 is configured such that the optical reflectance of the high-reflectance film 15 becomes about 8.8% near the gain peak wavelength (about 1280 nm) of the active layer 12.

The low reflectance film 14 is formed by stacking two sets of an Al$_2$O$_3$ layer with a thickness of about 225 nm and a TiO$_2$ layer with a thickness of about 245 nm to adjust the optical reflectance to about 10%. The high-reflectance film 15 is formed by stacking five sets of an Si layer with a thickness of about 109 nm and an Al$_2$O$_3$ layer with a thickness of about 251 nm. With this configuration, in the ambient temperature, the high-reflectance film 15 has an optical reflectance of about 90% (at a DFB wavelength of about 1310 nm) and has an optical reflectance of about 8.8% near the gain peak wavelength (about 1280 nm) of the quantum dots. Other parameters of the DFB-LD of Example 3 are substantially the same as those of the DFB-LD of Example 1.

Figure 8:
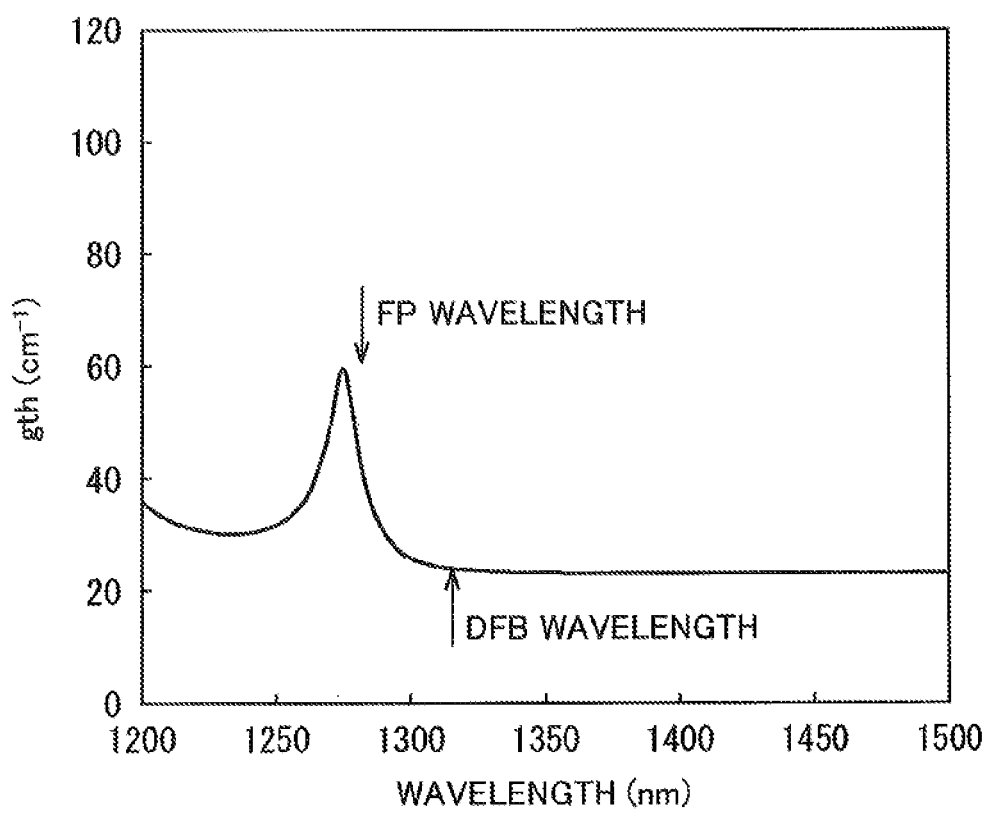
FIG. 8 is a graph indicating characteristics of a DFB-LD according to a third example of the first embodiment.

As illustrated in FIG. 8, because the optical reflectance of the low-reflectance film 14 at the front-end face is set at about 10%, the oscillation threshold gain $g_{th}$ in the FP mode at a gain peak wavelength of about 1280 nm increases to about 47 cm$^{-1}$. As a result, the FP-mode oscillation at a gain peak wavelength of about 1280 nm is suppressed. In Example 3, the oscillation threshold gain $g_{th}$ in the FP mode at the gain peak wavelength of the active layer 12 can be made greater than or equal to about 30 cm$^{-1}$ by setting the optical reflectance of the high-reflectance film 15 at the gain peak wavelength of the active layer 12 at a value less than or equal to about 50%. This configuration makes it possible to suppress the FP-mode oscillation at the gain peak wavelength of the active layer 12.

Thus, the configuration of Example 3 can improve the feedback-light resistance of a DFB-LD and improve the stability of the single-mode operation.

Second Embodiment

Figure 9:
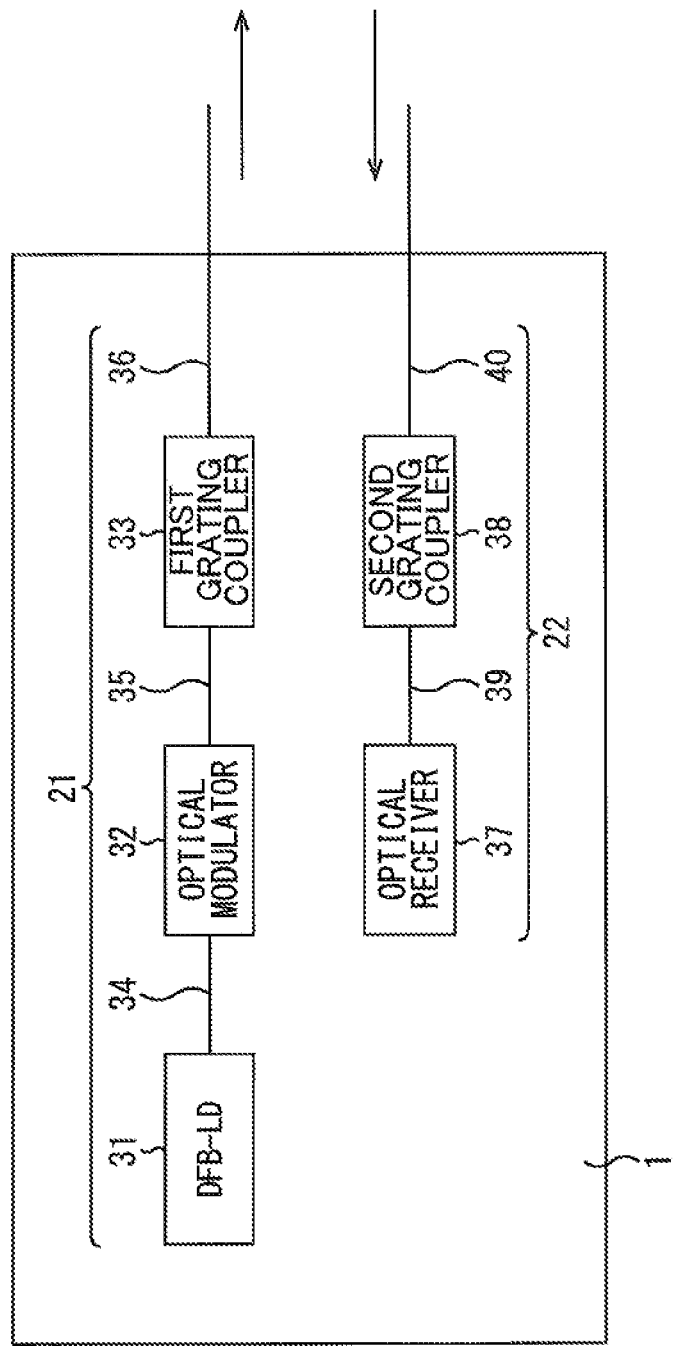
FIG. 9 is a block diagram illustrating a configuration of an optical transceiver according to a second embodiment.

An optical transceiver, which is an example of an optical device, according to a second embodiment is described below. FIG. 9 is a block diagram illustrating a configuration of the optical transceiver according to the second embodiment. The same reference numbers as those used in the first embodiment are assigned to components corresponding to the components of the DFB-LD of the first embodiment, and detailed descriptions of those components are omitted.

The optical transceiver includes an optical transmitter 21 and an optical receiver module 22 that are disposed on, for example, a silicon substrate 1.

The optical transmitter 21 includes a DFB-LD 31, an optical modulator 32 for modulating light emitted from the DFB-LD 31, and a first grating coupler 33 that is an emitter for emitting light received from the optical modulator 32. The DFB-LD 31 corresponds to the DFB-LD of the first embodiment and includes the optical waveguide 2, the reflecting mirrors 3, and a pair of electrodes. The DFB-LD 31 is optically connected to the optical modulator 32 via a first optical waveguide 34, and the optical modulator 32 is optically connected to the first grating coupler 33 via a second optical waveguide 35. A first optical fiber 36 is optically connected to an emitting end of the first grating coupler 33.

Figure 10:
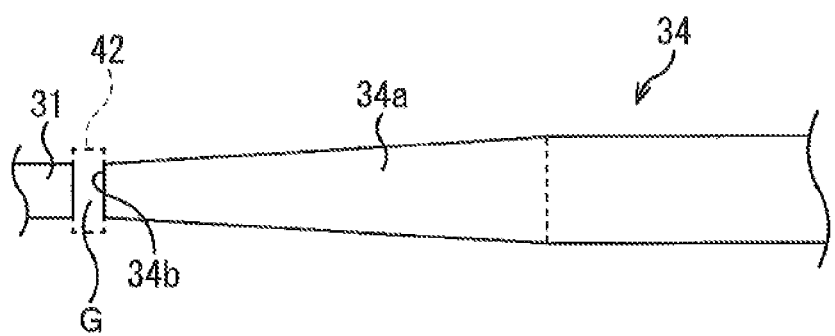
FIG. 10 is an enlarged view of a first optical waveguide that is optically connected to a DFB-LD.

FIG. 10 is an enlarged view of the first optical waveguide 34 that is optically connected to the DFB-LD 31.

The first optical waveguide 34 is disposed to face the DFB-LD 31 across a gap G. An optical mode shape (intensity distribution of light, and the size and shape of the intensity distribution) at an end face 34b of the first optical waveguide 34 facing the DFB-LD 31 substantially matches the optical mode shape of light emitted from the DFB-LD 31. Specifically, the first optical waveguide 34 includes a line-shaped portion having a constant width (e.g., having a width of about 350 nm and a height of about 200 nm) and an end portion 34a. The end portion 34a has a tapered shape whose width gradually decreases toward the end face 34b. The width of the end face 34b is, for example, about 170 nm. At the end face 34b, the optical mode shape is enlarged to, for example, about 2 μm in diameter and becomes substantially the same as the optical mode shape of light emitted from the DFB-LD 31. Adjusting the optical mode shape at the end face 34b of the first optical waveguide 34 to substantially match the optical mode shape of light emitted from the DFB-LD 31 minimizes a mismatch between the optical mode of the DFB-LD 31 and the optical mode of the first optical waveguide 34. This in turn reduces an optical reflection resulting from the mismatch.

The gap G between the DFB-LD 31 and the first optical waveguide 34 is filled with a refractive index matching material 42 indicated by a dotted frame in FIG. 10. The refractive index matching material 42 has a transmission refractive index that is substantially the same as the transmission refractive index of the first optical waveguide 34, and is for example an epoxy resin. For example, the gap G is filled by dropping an epoxy resin into the gap G using, for example, a dropper. Filling the gap G with the refractive index matching material 42 having substantially the same transmission refractive index as the first optical waveguide 34 reduces the difference in refractive index between the DFB-LD 31 and the first optical waveguide 34 and thereby reduces an optical reflection.

The optical receiver module 22 includes an optical receiver 37 such as a photodetector (PD) and a second grating coupler 38 that is an entrance part for causing light to enter the optical receiver 37. The optical receiver 37 is optically connected to the second grating coupler 38 via a third optical waveguide 39. A second optical fiber 40 is optically connected to an incident end of the second grating coupler 38.

As described above, the second embodiment makes it possible to provide an optical transceiver including a DFB-LD that has a comparatively simple configuration but yet can operate in a single mode and has high feedback-light resistance.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor light-emitting device, comprising:
an active layer including quantum dots;
a diffraction grating;
a low-reflectance film disposed at a light-emitting end of the active layer; and
a high-reflectance film disposed at another end of the active layer and having an optical reflectance higher than an optical reflectance of the low-reflectance film,
wherein the semiconductor light-emitting device is a distributed-feedback (DFB) laser diode; and
the optical reflectance of the high-reflectance film is greater than or equal to 80% at a DFB wavelength and is less than or equal to 50% at a gain peak wavelength of the quantum dots of the active layer.

2. The semiconductor light-emitting device as claimed in claim 1, wherein the optical reflectance of the low-reflectance film is greater than or equal to 1% and less than or equal to 10%.

3. An optical device, comprising:
a semiconductor light-emitting device;
an optical modulator that modulates light emitted from the semiconductor light-emitting device; and
an emitter that emits light received from the optical modulator,
wherein the semiconductor light-emitting device includes an active layer including quantum dots,
a diffraction grating,
a low-reflectance film disposed at a light-emitting end of the active layer, and
a high-reflectance film disposed at another end of the active layer and having an optical reflectance higher than an optical reflectance of the low-reflectance film, wherein the semiconductor light-emitting device is a distributed-feedback (DFB) laser diode; and wherein the optical reflectance of the high-reflectance film is greater than or equal to 80% at a DFB wavelength and is less than or equal to 50% at a gain peak wavelength of the quantum dots of the active layer.

4. The optical device as claimed in claim 3, further comprising:

an optical receiver; and an entrance part that causes light to enter the optical receiver.

5. The optical device as claimed in claim 3, wherein the optical reflectance of the low-reflectance film is greater than or equal to 1% and less than or equal to 10%.

6. The optical device as claimed in claim 3, further comprising:

an optical waveguide that optically connects the semiconductor light-emitting device to the optical modulator, wherein the optical waveguide includes an end face facing the semiconductor light-emitting device; and an optical mode shape of the optical waveguide at the end face matches an optical mode shape of the semiconductor light-emitting device.

7. The optical device as claimed in claim 6, wherein the optical waveguide includes an end portion whose width gradually decreases toward the end face.

8. The optical device as claimed in claim 6, further comprising:

a refractive index matching material that fills a gap formed between the semiconductor light-emitting device and the optical waveguide.

* * * * *